(12) United States Patent
Watanabe et al.

(10) Patent No.: US 7,897,488 B2
(45) Date of Patent: Mar. 1, 2011

(54) DIVIDING METHOD FOR WAFER HAVING FILM ON THE FRONT SIDE THEREOF

(75) Inventors: Yosuke Watanabe, Ota-Ku (JP); Ryugo Oba, Ota-ku (JP); Masaru Nakamura, Ota-ku (JP)

(73) Assignee: Disco Corporation, Tokyo (JP)

( * ) Notice: Subject to any disclaimer, the term of this patent is extended or adjusted under 35 U.S.C. 154(b) by 58 days.

(21) Appl. No.: 12/468,556

(22) Filed: May 19, 2009

(65) Prior Publication Data

US 2009/0298263 A1 Dec. 3, 2009

(30) Foreign Application Priority Data

Jun. 2, 2008 (JP) .................................. 2008-144072

(51) Int. Cl.
*H01L 21/00* (2006.01)
(52) U.S. Cl. ......... 438/463; 438/118; 438/460; 438/462; 257/E21.244; 257/E21.596; 257/E21.237
(58) Field of Classification Search .................. 438/463, 438/118, 460, 462; 257/E21.596, E21.237, 257/E21.599
See application file for complete search history.

(56) References Cited

U.S. PATENT DOCUMENTS

2008/0153264 A1 * 6/2008 Nakamura et al. ............ 438/463

FOREIGN PATENT DOCUMENTS

JP B2 3408805 5/2003

* cited by examiner

*Primary Examiner* — Matthew S Smith
*Assistant Examiner* — Wilner Jean Baptiste
(74) *Attorney, Agent, or Firm* — Greer, Burns & Crain, Ltd.

(57) ABSTRACT

A wafer dividing method for dividing a wafer having a film on the front side thereof. The wafer dividing method includes a modified layer forming step of applying a laser beam having a transmission wavelength to the substrate of the wafer from the front side thereof along the streets so that a focal point of the laser beam is set inside the substrate, thereby forming a modified layer in the substrate along each street, a film dividing step of applying a laser beam having an absorption wavelength to the film from the front side of the wafer along each street to thereby form a laser processed groove for dividing the film along each street, a back grinding step of grinding the back side of the substrate of the wafer to thereby reduce the thickness of the wafer to a predetermined thickness, a wafer supporting step of attaching the wafer to a dicing tape supported to an annular frame, and a wafer breaking step of applying an external force to the wafer by expanding the dicing tape to thereby break the wafer along each street.

7 Claims, 10 Drawing Sheets

DIVIDING METHOD FOR WAFER HAVING FILM ON THE FRONT SIDE THEREOF

BACKGROUND OF THE INVENTION

1. Field of the Invention

The present invention relates to a wafer dividing method for dividing a wafer into individual devices along a plurality of crossing streets formed on the front side of the wafer, wherein the devices are respectively formed in a plurality of areas partitioned by the streets.

2. Description of the Related Art

In a semiconductor device fabrication process, a plurality of crossing streets (division lines) are formed on the front side of a substantially disk-shaped semiconductor wafer to partition a plurality of areas where devices such as ICs, LSIs, liquid crystal drivers, and flash memories are respectively formed. The wafer is cut along the streets to divide these areas from each other along the streets, thereby producing the individual devices.

As a method of dividing the wafer along the streets, a laser processing method using a pulsed laser beam having a transmission wavelength to the wafer has been proposed. In this laser processing method, the pulsed laser beam is applied to the wafer along the streets in the condition where a focal point of the pulsed laser beam is set inside the wafer in a subject area to be laser-processed. In such a wafer dividing method using laser processing, the pulsed laser beam having a transmission wavelength to the wafer is applied to the wafer from one side thereof in the condition where the focal point is set inside the wafer, thereby continuously forming a modified layer inside the wafer along each street. By forming the modified layer along each street, the strength of the wafer along the modified layer is reduced. Accordingly, by applying an external force to the wafer along each street, the wafer can be broken along each street to obtain the individual devices. According to this dividing method, the width of each street can be reduced (see Japanese Patent No. 3408805, for example).

However, in the case that the surface of each street is covered with a film such as a metal film, fluorosilicate glass film, silicon oxide based passivation film ($SiO_2$, SiON), polyimide (PI) based polymer film, fluorine based polymer film, and fluorinated amorphous carbon based compound film, the following problem arises. That is, the substrate of the wafer can be divided by applying a pulsed laser beam having a transmission wavelength to the substrate along each street in the condition where the focal point of the pulsed laser beam is set inside the substrate to thereby form a modified layer inside the substrate along each street. However, the film formed on the surface of each street cannot be divided by this method.

SUMMARY OF THE INVENTION

It is therefore an object of the present invention to provide a wafer dividing method which can divide a wafer having a film on the front side thereof without leaving the film along the street.

In accordance with an aspect of the present invention, there is provided a wafer dividing method for dividing a wafer into individual devices along a plurality of crossing streets formed on the front side of a substrate, wherein the devices are respectively formed in a plurality of areas partitioned by the streets, and the front side of the substrate is covered with a film. The wafer dividing method includes a modified layer forming step of applying a laser beam having a transmission wavelength to the substrate from the front side of the wafer along the streets so that a focal point of the laser beam is set inside the substrate, thereby forming a modified layer in the substrate along each street; a film dividing step of applying a laser beam having an absorption wavelength to the film from the front side of the wafer along each street to thereby form a laser processed groove for dividing the film along each street; a back grinding step of grinding the back side of the substrate of the wafer to thereby reduce the thickness of the wafer to a predetermined thickness; a wafer supporting step of attaching the backside of the wafer to the front side of a dicing tape supported to an annular frame after the back grinding step; and a wafer breaking step of applying an external force to the wafer by expanding the dicing tape supported to the annular frame, in the condition where the back side of the wafer is attached to the front side of the dicing tape, to thereby break the wafer along each street.

According to the wafer dividing method of the present invention, after performing the modified layer forming step to form the modified layer in the substrate along each street and next performing the film dividing step to divide the film formed on the front side of the substrate along each street, the wafer is broken along each street by applying an external force. Accordingly, in the wafer breaking step, the film has already been divided along each street, so that the film is not left along each street.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
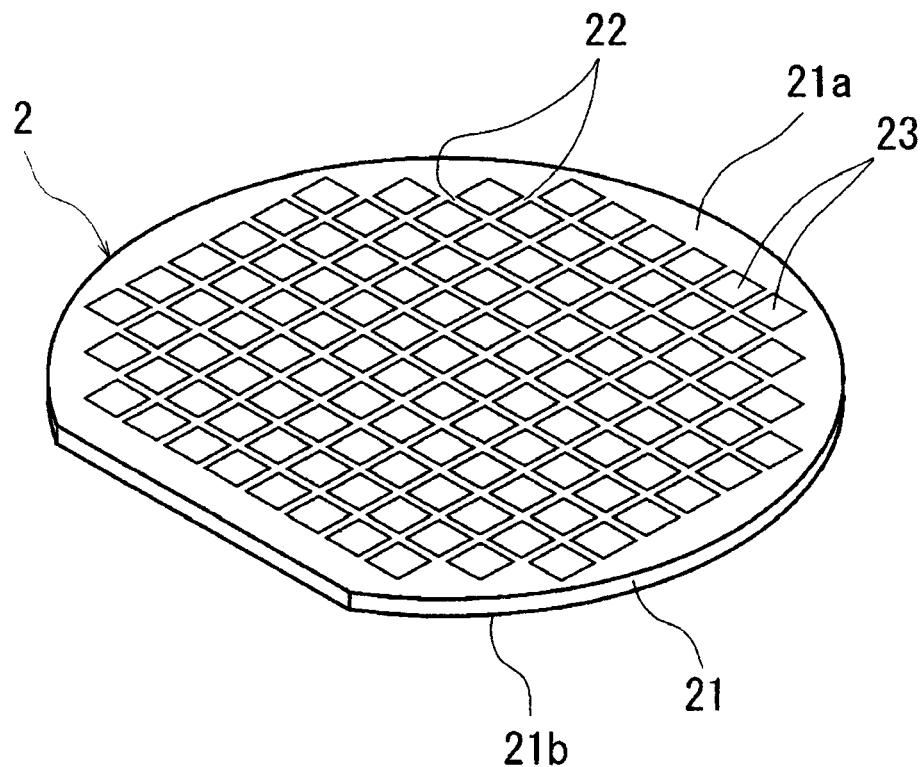
FIG. 1 is a perspective view of a wafer to be divided by the wafer dividing method according to the present invention.
Figure 2:
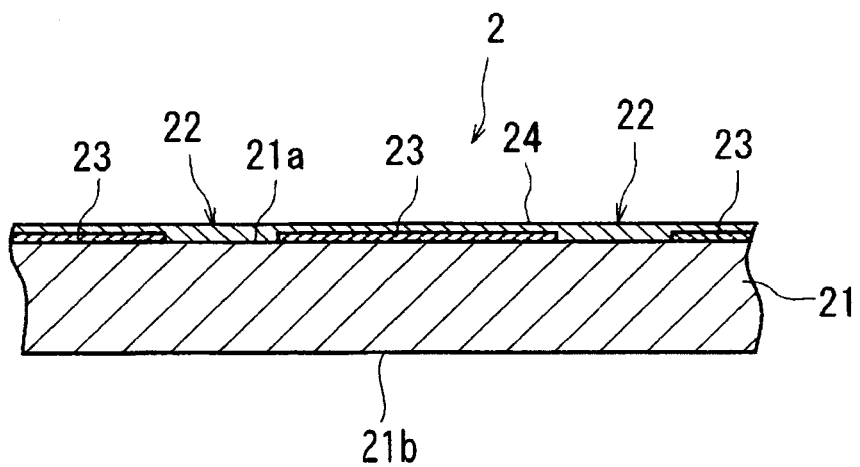
FIG. 2 is an enlarged sectional view of an essential part of the wafer shown in FIG. 1.

A preferred embodiment of the wafer dividing method according to the present invention will now be described in detail with reference to the attached drawings. FIG. 1 shows a perspective view of a wafer 2 to be divided by the wafer dividing method according to the present invention. FIG. 2 shows an enlarged sectional view of an essential part of the wafer 2 shown in FIG. 1. The wafer 2 shown in FIGS. 1 and 2 is formed from a silicon substrate 21 having a thickness of 600 µm, for example. A plurality of crossing streets 22 are formed on the front side 21a of the silicon substrate 21, thereby partitioning a plurality of rectangular areas in which a plurality of devices 23 such as ICs, LSIs, liquid crystal drivers, and flash memories are respectively formed. According to the embodiment as shown in FIG. 2, for the wafer 2, a polyimide (PI) based polymer film 24 is formed on the front side 21a of the silicon substrate 21 so as to fully cover the streets 22 and the devices 23.

The wafer dividing method for dividing the wafer 2 into the individual devices 23 will now be described. The wafer dividing method according to this preferred embodiment includes as a first step a modified layer forming step of applying a laser beam having a transmission wavelength to the substrate 21 of the wafer 2 from the front side of the wafer 2 along the streets 22 so that a focal point of the laser beam is set inside the substrate 21, thereby forming a modified layer in the substrate 21 along each street 22. This modified layer forming step is performed by using a laser processing apparatus 3 shown in FIG. 3. The laser processing apparatus 3 shown in FIG. 3 includes a chuck table 31 for holding the wafer 2, laser beam applying means 32 for applying a laser beam to the wafer 2 held on the chuck table 31, and imaging means 33 for imaging the wafer 2 held on the chuck table 31. The chuck table 31 is so configured as to hold the wafer 2 by using suction means (not shown). The chuck table 31 is movable both in a feeding direction shown by an arrow X in FIG. 3 by means of a feeding mechanism (not shown) and in an indexing direction shown by an arrow Y in FIG. 3 by means of an indexing mechanism (not shown).

The laser beam applying means 32 includes a cylindrical casing 321 extending in a substantially horizontal direction. Although not shown, the casing 321 contains pulsed laser beam oscillating means including a pulsed laser beam oscillator and repetition frequency setting means. Examples of the pulsed laser beam oscillator include a YAG laser oscillator and a YVO4 laser oscillator. The pulsed laser beam oscillating means in this preferred embodiment oscillates a pulsed laser beam having a transmission wavelength (e.g., 1064 nm) to the substrate 21 of the wafer 2. The laser beam applying means 32 further includes focusing means 322 mounted on the front end of the casing 321 for focusing the pulsed laser beam oscillated from the pulsed laser beam oscillating means.

The imaging means 33 is mounted on the front end portion of the casing 321 of the laser beam applying means 32. The imaging means 33 includes an ordinary imaging device (CCD) for imaging the wafer 2 by using visible light, infrared light applying means for applying infrared light to the wafer 2, an optical system for capturing the infrared light applied to the wafer 2 by the infrared light applying means, and an imaging device (infrared CCD) for outputting an electrical signal corresponding to the infrared light captured by the optical system. An image signal output from the imaging means 33 is transmitted to control means (not shown).

Figure 3:
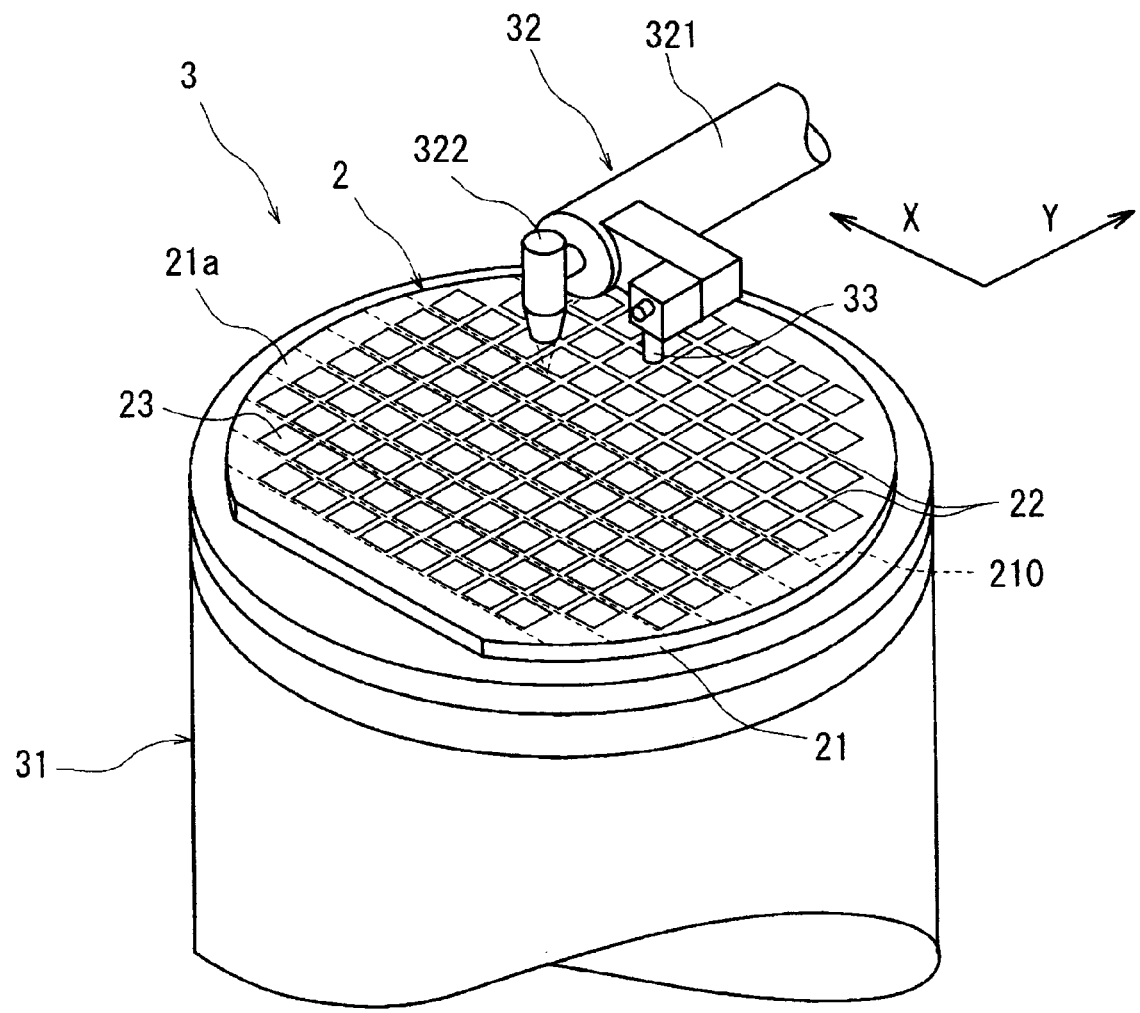
FIG. 3 is a perspective view of an essential part of a laser processing apparatus for performing a modified layer forming step in the wafer dividing method according to the present invention.

In performing the modified layer forming step by using the laser processing apparatus 3 shown in FIG. 3, the wafer 2 is first placed on the chuck table 31 in the condition where the back side 21b of the substrate 21 is in contact with the upper surface of the chuck table 31. Thereafter, the suction means is operated to hold the wafer 2 on the chuck table 31 under suction (wafer holding step). Accordingly, the front side 21a of the substrate 21 held on the chuck table 31 is oriented upward. Thereafter, the chuck table 31 thus holding the wafer 2 by suction is moved to a position directly below the imaging means 33 by the feeding mechanism.

In this condition where the chuck table 31 is positioned directly below the imaging means 33, an alignment step is performed by the imaging means 33 and the control means (not shown) to detect a subject area of the wafer 2 to be laser-processed. More specifically, the imaging means 33 and the control means (not shown) perform image processing such as pattern matching for making the alignment of the streets 22 formed on the substrate 21 of the wafer 2 and the focusing means 322 of the laser beam applying means 32 for applying the laser beam along the streets 22, thus performing the alignment of a laser beam applying position. Even when the polyimide (PI) based polymer film 24 formed on the front side 21a of the substrate 21 so as to fully cover the streets 22 and the devices 23 is not transparent, the streets 22 can be imaged through the polyimide (PI) based polymer film 24 by the imaging means 33 including the infrared light applying means, the optical system for capturing infrared light, and the imaging device (infrared CCD) for outputting an electrical signal corresponding to the infrared light as mentioned above.

Figure 4A:
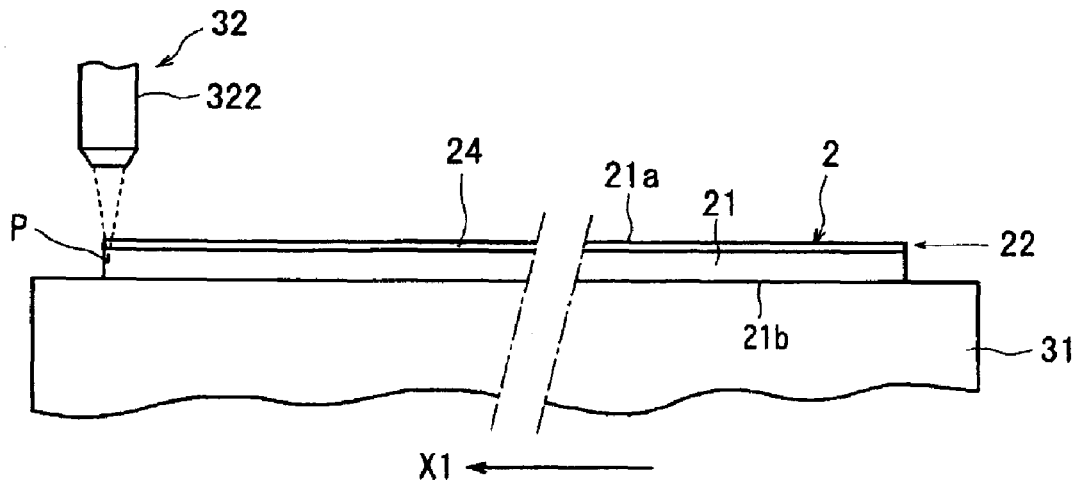
FIGS. 4A and 4B are schematic side views for illustrating the modified layer forming step in the wafer dividing method according to the present invention.
Figure 4B:
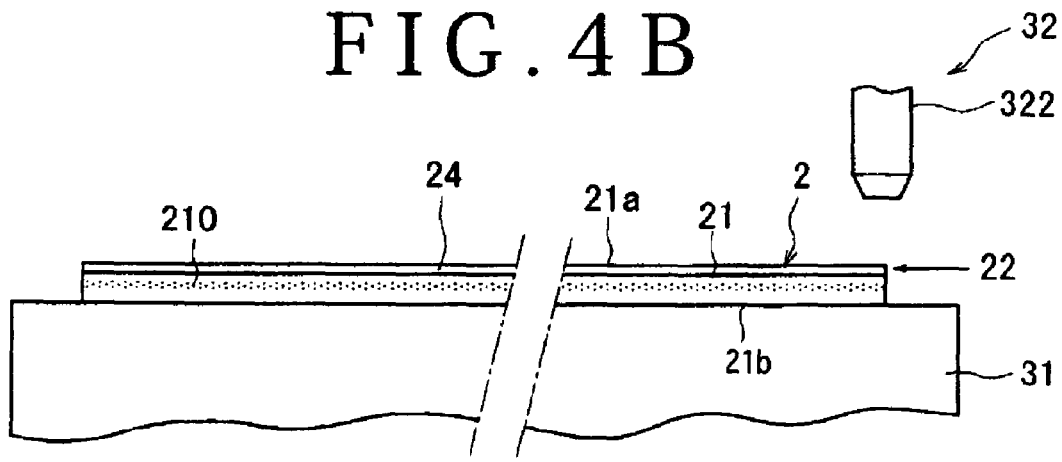
Figure 5:
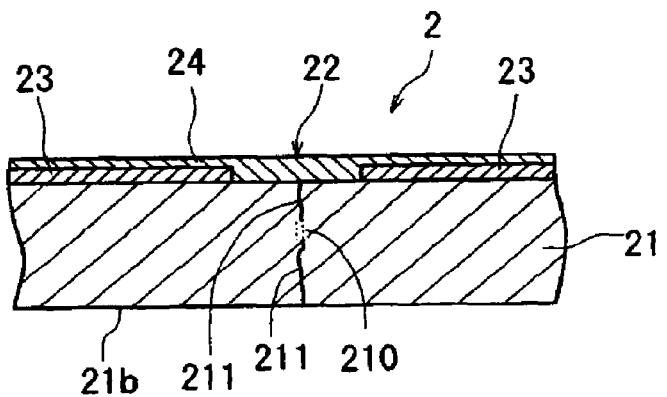
FIG. 5 is an enlarged sectional view of an essential part of the wafer processed by the modified layer forming step shown in FIGS. 4A and 4B.

After performing this alignment step for detecting a subject area to be laser-processed of the wafer 2 held on the chuck table 31, the chuck table 31 is moved to a laser beam applying area where the focusing means 322 of the laser beam applying means 32 which applies laser beam is located as shown in FIG. 4A, thereby positioning one end (left end as viewed in FIG. 4A) of a predetermined one of the first streets 22 directly below the focusing means 322 of the laser beam applying means 32. In this condition, a pulsed laser beam having a transmission wavelength to the silicon substrate 21 is applied from the focusing means 322 along the predetermined first street 22, and the chuck table 31 is moved in the direction shown by an arrow X1 in FIG. 4A at a predetermined feed speed. When the laser beam applying position of the focusing means 322 of the laser beam applying means 32 reaches the other end (right end as viewed in FIG. 4B) of the predetermined first street 22, the application of the pulsed laser beam is stopped and the movement of the chuck table 31 is also stopped. In the modified layer forming step, the focal point P of the pulsed laser beam is set at the middle of the thickness of the wafer 2. As a result, a modified layer 210 is formed in the substrate 21 of the wafer 2 at the middle of the thickness thereof along the predetermined first street 22 as shown in FIGS. 4B and 5. By forming the modified layer 210 in the substrate 21 of the wafer 2 along the predetermined first street 22, cracks 211 are produced from the modified layer 210 toward the front side 21a and the back side 21b of the substrate 21 so as to extend along the predetermined first street 22 as shown in FIG. 5.

For example, this modified layer forming step is performed under the following processing conditions.

Light source: LD pumped Q-switched Nd:YVO4 pulsed laser
    Wavelength: 1064 nm
    Average power: 1 W
    Pulse width: 40 ns
    Repetition frequency: 100 kHz
    Focused spot diameter: φ 1 μm
    Work feed speed: 100 mm/sec After performing the modified layer forming step along all of the first streets 22 extending in the predetermined direction on the wafer 2, the chuck table 31 is rotated 90° to similarly perform the modified layer forming step along all of the second streets 22 perpendicular to the first streets 22.

Figure 6:
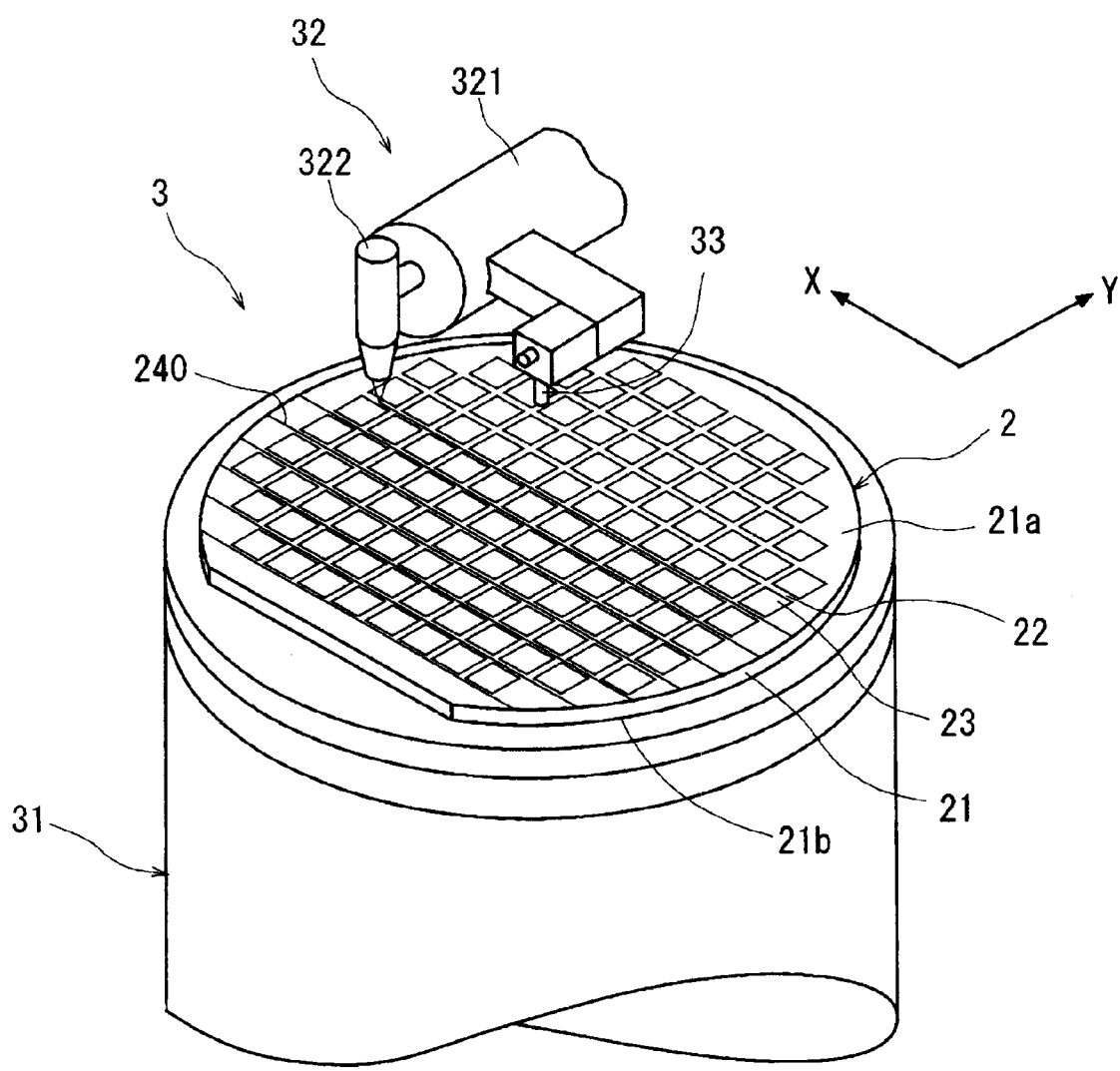
FIG. 6 is a perspective view of an essential part of a laser processing apparatus for performing a film dividing step in the wafer dividing method according to the present invention.

After thus finishing the modified layer forming step along all of the first and second streets 22, a film dividing step is performed in such a manner that a laser beam having an absorption wavelength to the polymer film 24 formed on the front side 21a of the substrate 21 of the wafer 2 is applied to the polymer film 24 from the front side 21a along each street 22 to thereby form a laser processed groove and accordingly divide the polymer film 24 along each street 22. This film dividing step is performed by using a laser processing apparatus 3 shown in FIG. 6, which is similar to that shown in FIG. 3. In FIG. 6, the parts of the laser processing apparatus 3 similar to those shown in FIG. 3 are denoted by the same reference numerals. The laser beam applying means 32 shown in FIG. 6 includes pulsed laser beam oscillating means for oscillating a pulsed laser beam having an absorption wavelength (e.g., 355 nm) to the polymer film 24.

The film dividing step using the laser processing apparatus 3 shown in FIG. 6 will now be described with reference to FIGS. 6 to 8. First, the wafer 2 is placed on the chuck table 31 of the laser processing apparatus 3 shown in FIG. 6 in the condition where the back side 21b of the substrate 21 is in contact with the upper surface of the chuck table 31. Thereafter, suction means (not shown) is operated to hold the wafer 2 on the chuck table 31 under suction (wafer holding step). Accordingly, the front side 21a of the substrate 21 held on the chuck table 31 is oriented upward.

Thereafter, the chuck table 31 thus holding the wafer 2 by suction is moved to a position directly below the imaging means 33 shown in FIG. 6 by a feeding mechanism (not shown). In this condition where the chuck table 31 is positioned directly below the imaging means 33, an alignment step is performed by the imaging means 33 and control means (not shown) to detect a subject area of the wafer 2 to be laser-processed. This alignment step is similar to the alignment step in the modified layer forming step mentioned above.

Figure 7A:
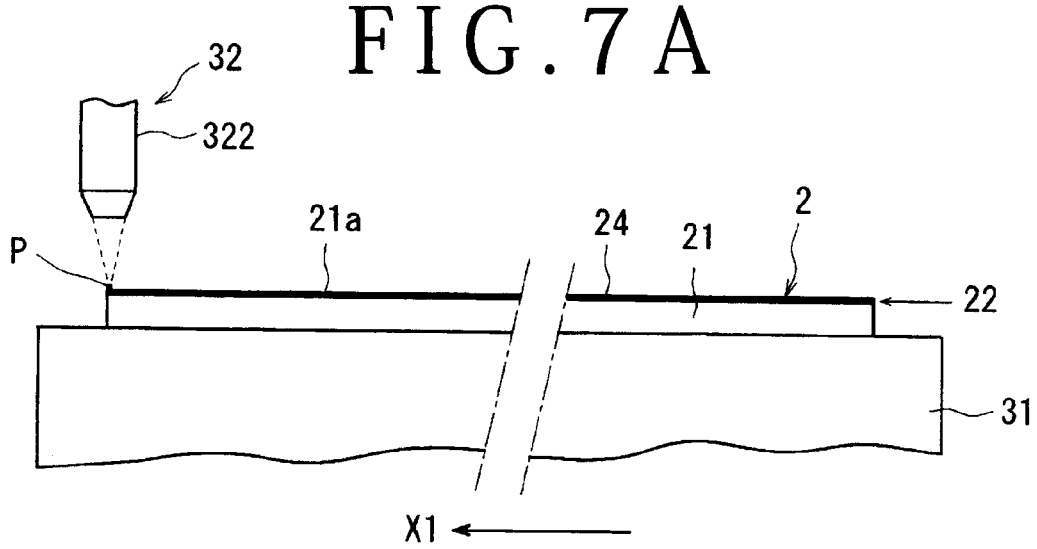
FIGS. 7A and 7B are schematic side views for illustrating the film dividing step in the wafer dividing method according to the present invention.
Figure 7B:
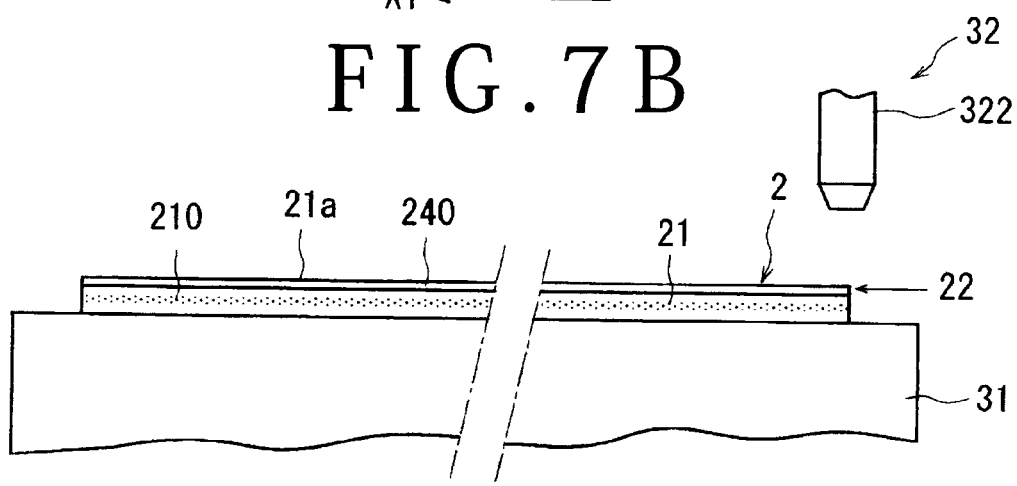

After performing the alignment step for detecting a subject area to be laser-processed of the wafer 2 held on the chuck table 31, the chuck table 31 is moved to a laser beam applying area where the focusing means 322 of the laser beam applying means 32 which applies laser beam is located as shown in FIG. 7A, thereby positioning one end (left end as viewed in FIG. 7A) of a predetermined one of the first streets 22 directly below the focusing means 322 of the laser beam applying means 32. In this condition, a pulsed laser beam having an absorption wavelength to the polymer film 24 is applied from the focusing means 322 along the predetermined first street 22, and the chuck table 31 is moved in the direction shown by an arrow X1 in FIG. 7A at a predetermined feed speed. When the laser beam applying position of the focusing means 322 reaches the other end (right end as viewed in FIG. 7B) of the predetermined first street 22, the application of the pulsed laser beam from the focusing means 322 is stopped and the movement of the chuck table 31 is also stopped. In this film dividing step, the focal point P of the pulsed laser beam to be applied in this film dividing step is set near the upper surface of the polymer film 24 formed on the front side 21a of the substrate 21 of the wafer 2.

Figure 8:
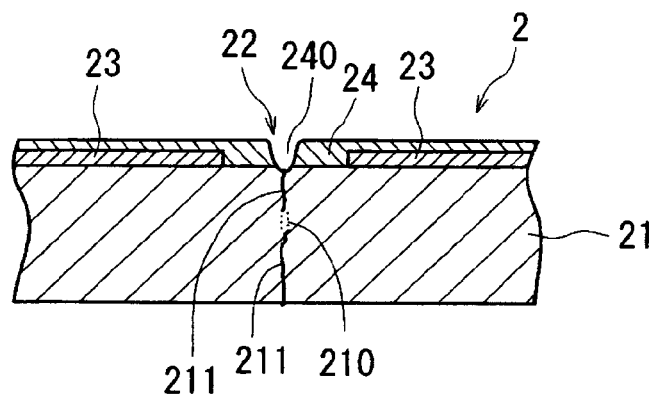
FIG. 8 is an enlarged sectional view of an essential part of the wafer processed by the film dividing step shown in FIGS. 7A and 7B.

By performing this film dividing step, a laser processed groove 240 is formed on the polymer film 24 along the predetermined first street 22 so that the substrate 21 is exposed to the groove 240 as shown in FIG. 8. As a result, the polymer film 24 covering the predetermined first street 22 is divided by the laser processed groove 240 along the predetermined first street 22. In this film dividing step, the polymer film 24 is laser-processed to sublime at once. However, the substrate 21 formed of silicon is not laser-processed, so that the generation of debris due to laser processing can be suppressed.

For example, this film dividing step is performed under the following processing conditions.

Light source: LD pumped Q-switched Nd:YVO4 pulsed laser
    Wavelength: 355 nm (third harmonic generation of YVO4 laser)
    Average power: 1 W
    Pulse width: 40 ns
    Repetition frequency: 50 kHz
    Focused spot diameter: φ 5 μm
    Work feed speed: 100 mm/sec After performing the film dividing step along all of the first streets 22 extending in the predetermined direction of the wafer 2, the chuck table 31 is rotated 90° to similarly perform the film dividing step along all of the second streets 22 perpendicular to the first streets 22.

Figure 9A:
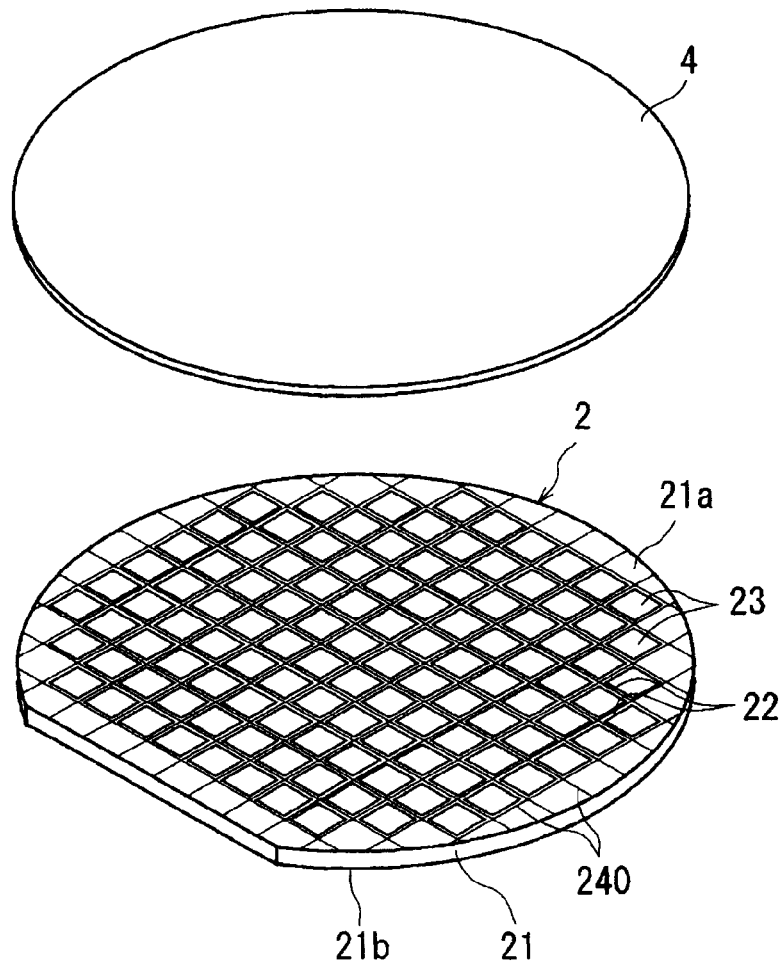
FIGS. 9A and 9B are perspective views for illustrating a protective tape attaching step in the wafer dividing method according to the present invention.
Figure 9B:
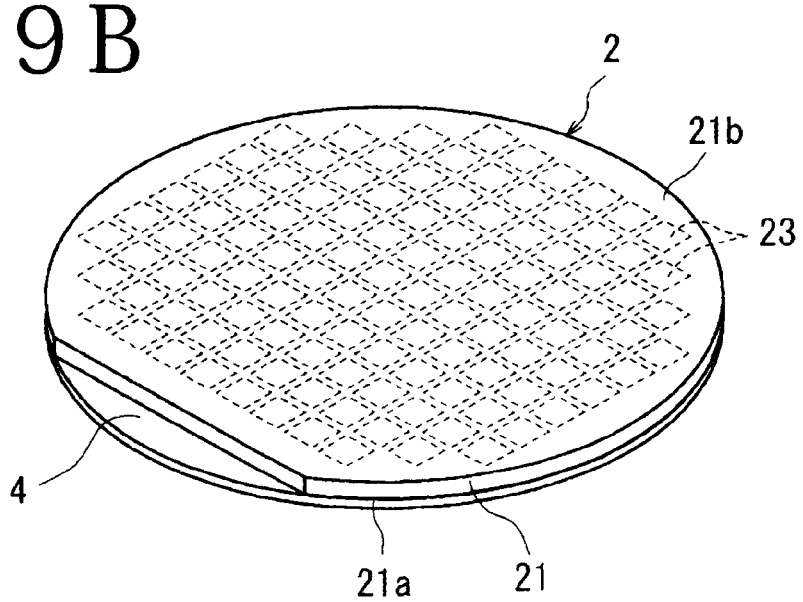

Thereafter, a back grinding step is performed in such a manner that the back side 21b of the substrate 21 of the wafer 2 is ground to reduce the thickness of the wafer 2 to a predetermined thickness. Prior to performing this back grinding step, a protective tape 4 of polyvinyl chloride or the like is attached to the front side 21a of the substrate 21 of the wafer 2 as shown in FIGS. 9A and 9B in order to protect the devices 23 formed on the front side 21a of the substrate 21 (protective tape attaching step).

Figure 10A:
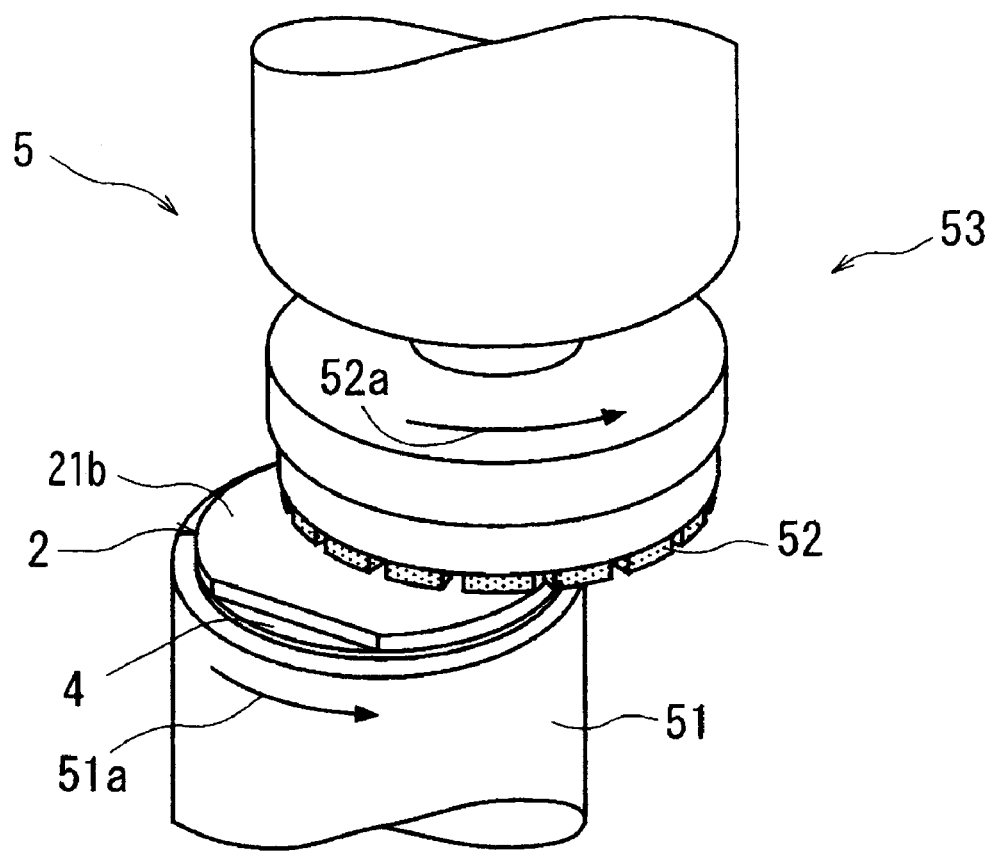
FIG. 10A is a perspective view showing a grinding apparatus for performing a back grinding step in the wafer dividing method according to the present invention.
Figure 10B:
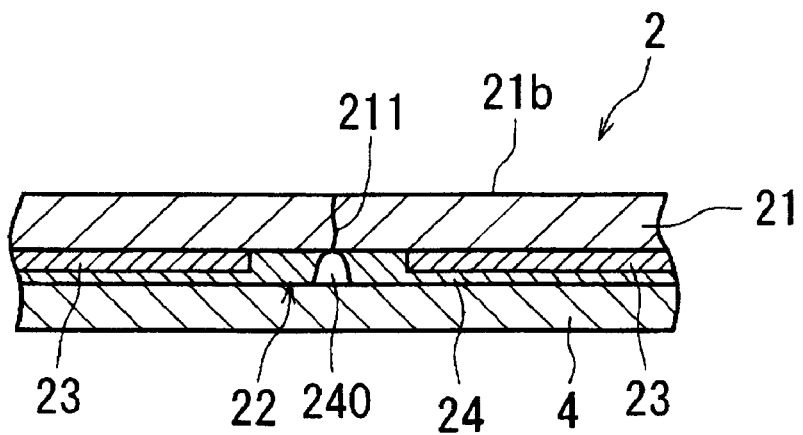
FIG. 10B is an enlarged sectional view of the wafer processed by the back grinding step.

The back grinding step is performed by using a grinding apparatus 5 shown in FIG. 10A. The grinding apparatus 5 shown in FIG. 10A includes a chuck table 51 for holding the wafer 2 and grinding means 53 having a grinding wheel 52 for grinding the back side 21b of the substrate 21 of the wafer 2 held on the chuck table 51. In performing the back grinding step by using the grinding apparatus 5, the wafer 2 is placed on the chuck table 51 in the condition where the protective tape 4 attached to the front side 21a of the substrate 21 of the wafer 2 is in contact with the upper surface of the chuck table 51. By operating suction means (not shown), the wafer 2 is held on the chuck table 51 under suction. Accordingly, the back side 21b of the substrate 21 of the wafer 2 held on the chuck table 51 is oriented upward. In this condition, the chuck table 51 is rotated in the direction shown by an arrow 51a at 300 rpm, for example, and the grinding wheel 52 of the grinding means 53 is rotated in the direction shown by an arrow 52a at 6000 rpm, for example. Then, the grinding wheel 52 being rotated is brought into contact with the back side 21b of the substrate 21 of the wafer 2 being rotated, thereby grinding the back side 21b of the substrate 21 until the thickness of the wafer 2 is reduced to a predetermined thickness (e.g., 100 μm) as shown in FIG. 10B.

In the case that the modified layer 210 is formed at a depth of 100 μm or less measured from the front side 21a of the substrate 21 of the wafer 2 in the modified layer forming step, the modified layer 210 is left even after performing the back grinding step. However, in the case that the modified layer 210 is formed at a depth of greater than 100 μm measured from the front side 21a of the substrate 21 of the wafer 2, the modified layer 210 is removed by grinding the back side 21b of the substrate 21 in the back grinding step. Accordingly, as shown in FIG. 10B, the crack 211 formed along each street 22 on the front side 21a only is left.

Figure 11:
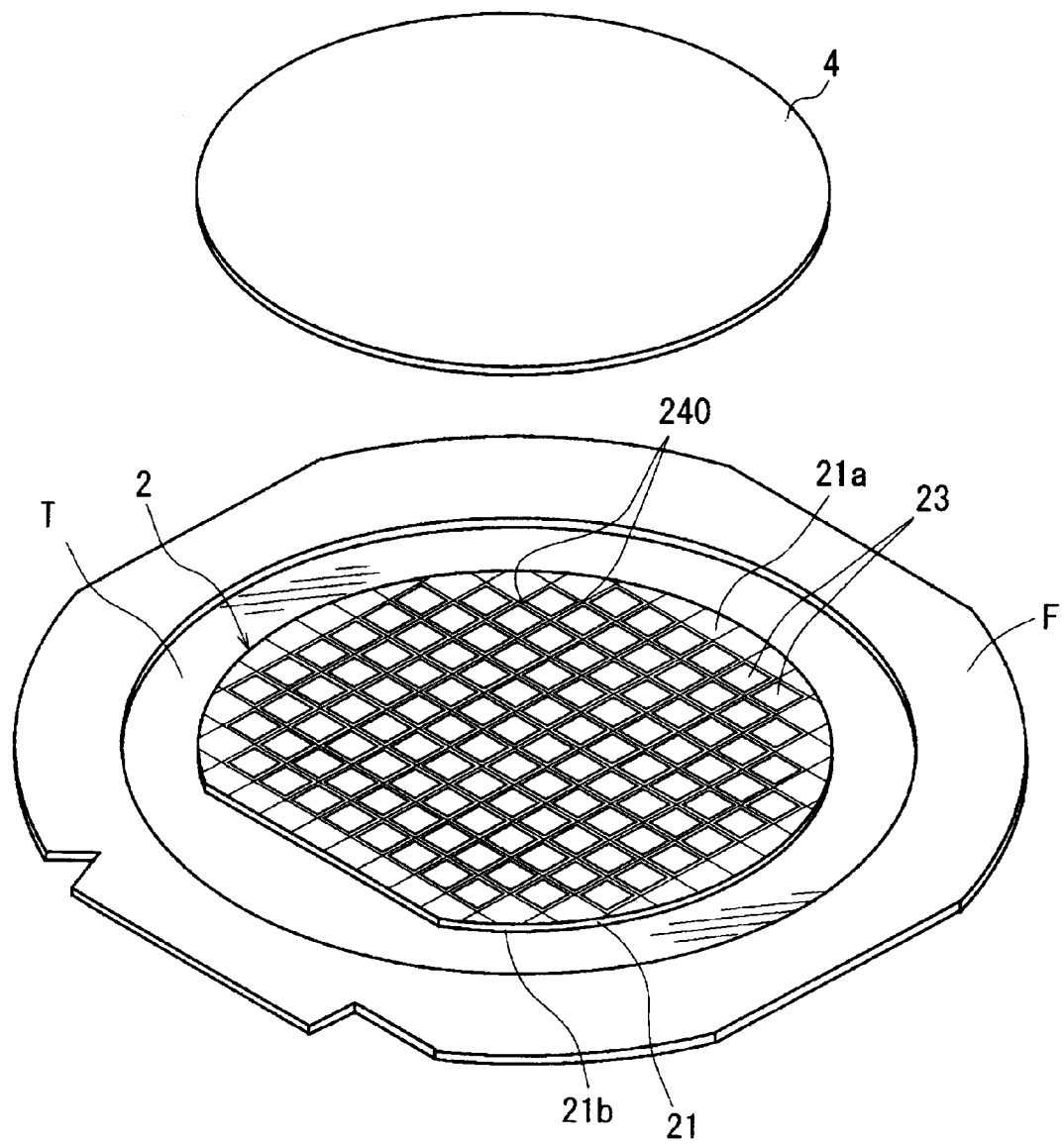
FIG. 11 is a perspective view for illustrating a wafer supporting step and a protective tape peeling step in the wafer dividing method according to the present invention.

After performing the back grinding step, a wafer supporting step is performed in such a manner that the back side 21b of the substrate 21 of the wafer 2 is attached to a dicing tape T supported to an annular frame F as shown in FIG. 11. More specifically, as shown in FIG. 11, the dicing tape T is preliminarily supported at its peripheral portion to the annular frame F. The wafer 2 is attached to the dicing tape T in the condition where the back side 21b of the substrate 21 of the wafer 2 is in contact with the upper surface of the dicing tape T (wafer supporting step). After attaching the back side 21b of the substrate 21 to the dicing tape T, the protective tape 4 is peeled off from the front side 21a of the substrate 21 of the wafer 2 (protective tape peeling step).

Figure 12:
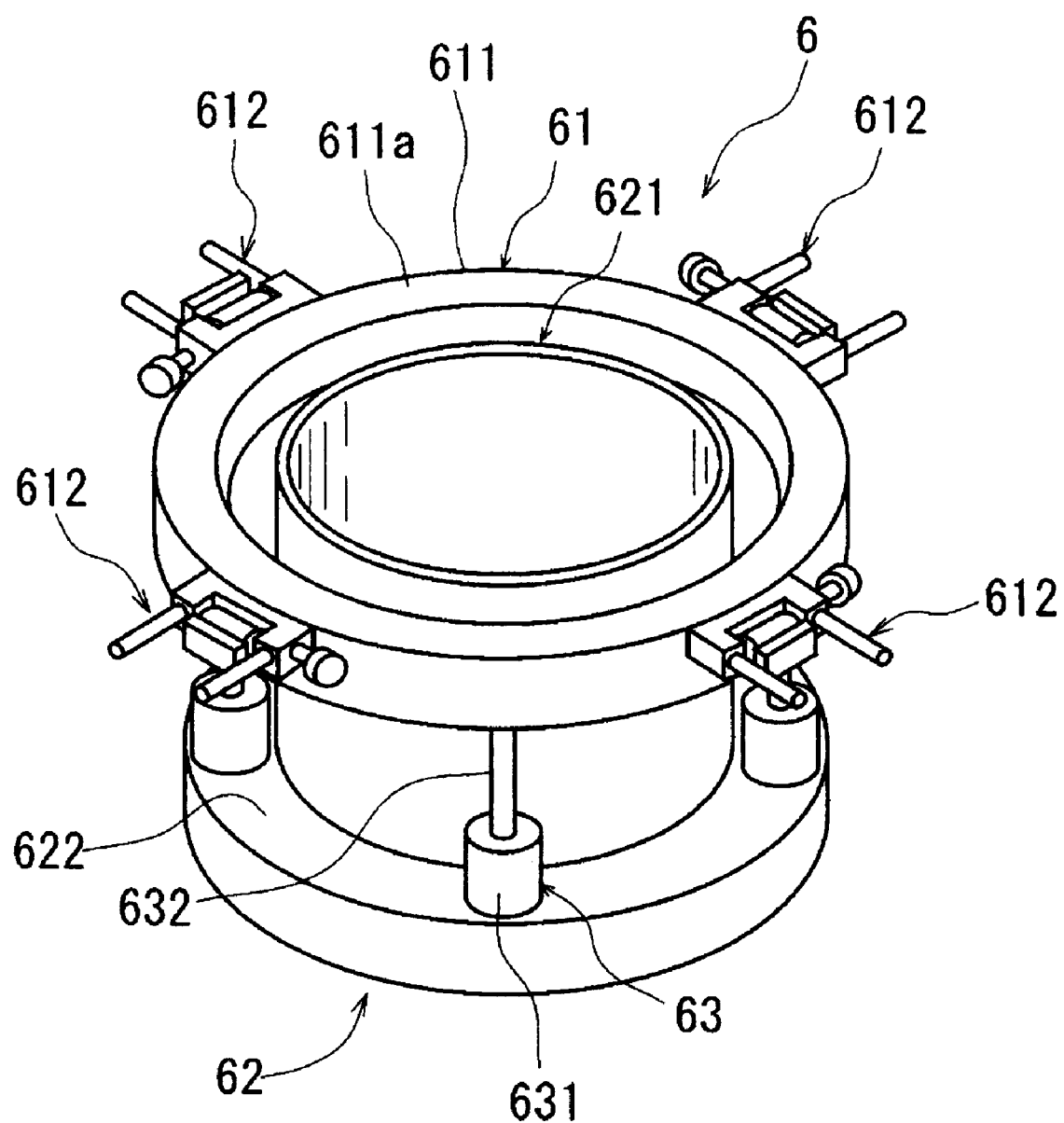
FIG. 12 is a perspective view showing a tape expanding apparatus for performing a wafer breaking step in the wafer dividing method according to the present invention.

After performing the wafer supporting step, a wafer breaking step is performed in such a manner that an external force is applied to the wafer 2 in the condition where the polymer film 24 has already been divided along each street 22 and the modified layer 210 has already been formed in the substrate 21 along each street 22, thereby breaking the wafer 2 along each street 22 to obtain the individual devices 23. This wafer breaking step is performed by using a tape expanding apparatus 6 shown in FIG. 12. The tape expanding apparatus 6 shown in FIG. 12 includes frame holding means 61 for holding the annular frame F and tape expanding means 62 for expanding the dicing tape T supported to the annular frame F held by the frame holding means 61.

The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame F thereon. The annular frame F mounted on the mounting surface 611a is fixed to the frame holding member 611 by the clamps 612. The frame holding means 61 is supported by the tape expanding means 62 so as to be vertically movable.

Figure 13A:
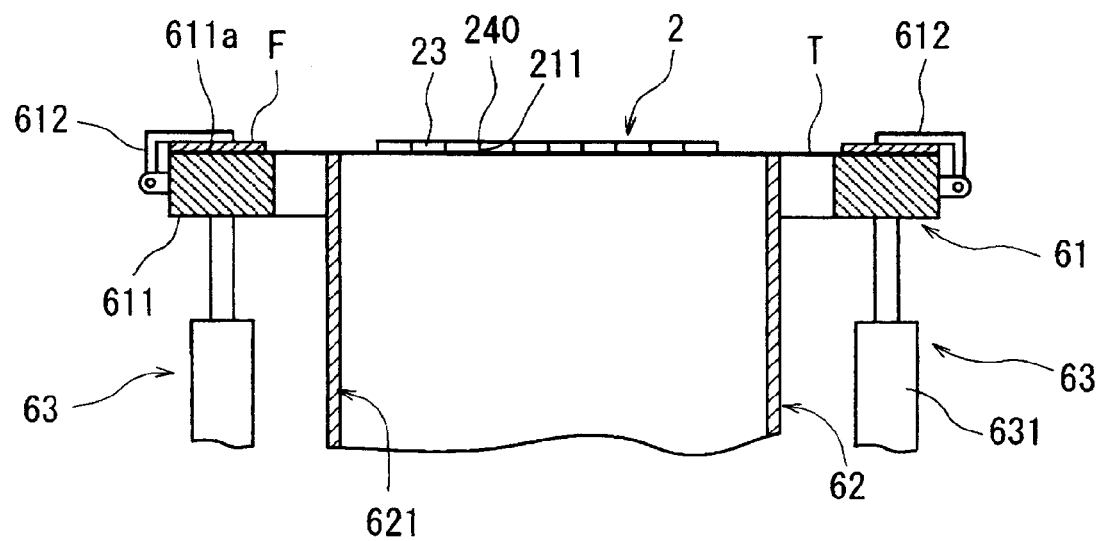
FIGS. 13A and 13B are schematic sectional views for illustrating the wafer breaking step in the wafer dividing method according to the present invention.
Figure 13B:
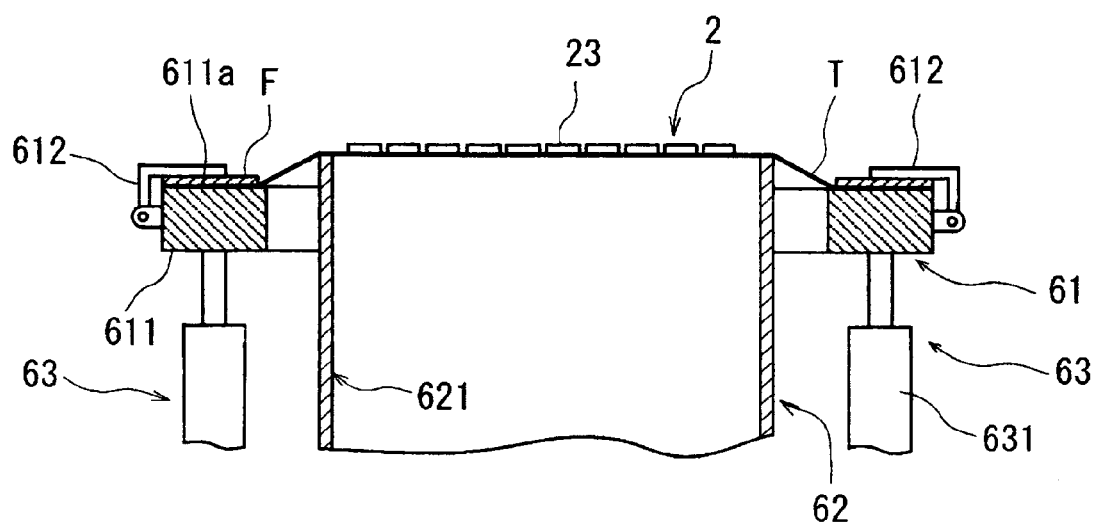

The tape expanding means 62 includes an expanding drum 621 provided inside of the annular frame holding member 611. The expanding drum 621 has an outer diameter smaller than the inner diameter of the annular frame F and an inner diameter larger than the outer diameter of the wafer 2 attached to the dicing tape T supported to the annular frame F. The expanding drum 621 has a supporting flange 622 at the lower end thereof. The tape expanding means 62 further includes supporting means 63 for vertically moving the annular frame holding member 611. The supporting means 63 is composed of a plurality of air cylinders 631 provided on the supporting flange 622. Each air cylinder 631 is provided with a piston rod 632 connected to the lower surface of the annular frame holding member 611. The supporting means 63 composed of the plural air cylinders 631 functions to vertically move the annular frame holding member 611 so as to selectively take a reference position where the mounting surface 611a is substantially equal in height to the upper end of the expanding drum 621 as shown in FIG. 13A and an expansion position where the mounting surface 611a is lower in height than the upper end of the expanding drum 621 by a predetermined amount as shown in FIG. 13B. Accordingly, the supporting means 63 composed of the plural air cylinders 631 functions as expansion moving means for relatively moving the expanding drum 621 and the frame holding member 611 in the vertical direction.

The wafer breaking step using the tape expanding apparatus 6 will now be described with reference to FIGS. 13A and 13B. As shown in FIG. 13A, the annular frame F supporting the wafer 2 through the dicing tape T is mounted on the mounting surface 611a of the frame holding member 611 of the frame holding means 61 and fixed to the frame holding member 611 by the clamps 612. In this stage, the crack 211 has already been formed in the substrate 21 of the wafer 2 along each street 22, and the laser processed groove 240 has already been formed in the polymer film 24 along each street 22. Further, the back side 21b of the substrate 21 of the wafer 2 has already been attached to the upper surface of the dicing tape T supported to the annular frame F. At this time, the frame holding member 611 is set at the reference position shown in FIG. 13A. Thereafter, the air cylinders 631 as the supporting means 63 of the tape expanding means 62 are operated to lower the frame holding member 611 to the expansion position shown in FIG. 13B.

Accordingly, the annular frame F fixed to the mounting surface 611a of the frame holding member 611 is also lowered, so that the dicing tape T supported to the annular frame F comes into abutment against the upper end of the expanding drum 621 and is expanded substantially in the radial direction of the expanding drum 621 as shown in FIG. 13B. As a result, a tensile force is radially applied to the wafer 2 attached to the dicing tape T, and the substrate 21 of the wafer 2 is therefore broken along each street 22 where the strength of the substrate 21 is lowered because of the presence of the cracks 211, thereby dividing the wafer 2 into the individual devices 23. At this time, the polymer film 24 formed on the substrate 21 of the wafer 2 has already been divided by the laser processed groove 240 formed along each street 22. That is, the polymer film 24 is not broken in this wafer breaking step.

In the back grinding step mentioned above, the back side 21b of the substrate 21 of the wafer 2 is ground to remove the modified layer 210. Accordingly, the wafer 2 is broken along the cracks 211 in the wafer breaking step, so that the broken surface of each device 23 after divided from the wafer 2 has no modified layer 210, thereby improving the bending strength of each device 23.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer dividing method for dividing a wafer into individual devices along a plurality of crossing streets formed on the front side of a substrate, wherein the devices are respectively formed in a plurality of areas partitioned by the streets, and the front side of the substrate is covered with a film, the wafer dividing method comprising:

a modified layer forming step of applying a laser beam having a transmission wavelength to the substrate from the front side of the wafer along the streets so that a focal point of the laser beam is set inside the substrate, thereby forming a modified layer in the substrate along each street;

a film dividing step of applying a laser beam having an absorption wavelength to the film from the front side of the wafer along each street to thereby form a laser processed groove for dividing the film along each street;

a back grinding step of grinding the back side of the substrate of the wafer to thereby reduce the thickness of the wafer to a predetermined thickness;

a wafer supporting step of attaching the back side of the wafer to the front side of a dicing tape supported to an annular frame after the back grinding step; and a wafer breaking step of applying an external force to the wafer by expanding the dicing tape supported to the annular frame, in the condition where the back side of the wafer is attached to the front side of the dicing tape, to thereby break the wafer along each street.

2. The wafer dividing method according to claim 1, wherein the modified layer formed by the modified layer forming step is approximately in the middle of the substrate in the thickness direction.

3. The wafer dividing method according to claim 1, wherein during said film dividing step, only the film is laser processed, and not the substrate, thereby minimizing the generation of debris from the substrate.

4. The wafer dividing method according to claim 1, wherein the modified layer forming step is performed with a laser beam of an average power of 1 W.

5. The wafer dividing method according to claim 1, wherein the modified layer forming step is performed with a laser beam of a wavelength of 1064 nm.

6. The wafer dividing method according to claim 1, wherein:

the modified layer forming step is performed with a laser beam of a wavelength of 1064 nm; and the film dividing step is performed with a laser beam of a wavelength of 355 nm.

7. The wafer dividing method according to claim 1, wherein the film is a polyimide based polymer film.

* * * * *